(12) United States Patent
Manouvrier et al.

(10) Patent No.: US 9,500,805 B2
(45) Date of Patent: Nov. 22, 2016

(54) OPTICAL WAVEGUIDE TO BE CARRIED BY A SEMICONDUCTOR MATERIAL INCLUDING A PLURALITY OF PARALLEL STRIPS OF ALTERNATING CONDUCTIVITY TYPES AND RELATED METHODS

(71) Applicants: STMICROELECTRONICS SA, Montrouge (FR); STMICROELECTRONICS (CROLLES 2) SAS, Crolles (FR)

(72) Inventors: Jean-Robert Manouvrier, Echirolles (FR); Patrick Lemaitre, Biviers (FR); Jean-Francois Carpentier, Grenoble (FR)

(73) Assignees: STMICROELECTRONICS SA, Montrouge (FR); STMICROELECTRONICS (CROLLES 2) SAS, Crolles (FR)

( * ) Notice: Subject to any disclaimer, the term of this patent is extended or adjusted under 35 U.S.C. 154(b) by 35 days.

(21) Appl. No.: 14/656,981

(22) Filed: Mar. 13, 2015

(65) Prior Publication Data

US 2015/0277038 A1  Oct. 1, 2015

(30) Foreign Application Priority Data

Mar. 31, 2014 (FR) .................. 14 52833

(51) Int. Cl.
- *G02B 6/13* (2006.01)
- *H01L 29/74* (2006.01)
- *G02B 6/12* (2006.01)
- *G02B 6/132* (2006.01)

(52) U.S. Cl.
CPC . *G02B 6/12* (2013.01); *G02B 6/13* (2013.01); *G02B 6/132* (2013.01); *H01L 29/74* (2013.01)

(58) Field of Classification Search
CPC ......... G02B 6/132; G02B 6/13; H01L 29/74; G02F 1/015; G02F 1/025; G02F 2001/0152; G02F 2001/305; G02F 2001/066; G02F 2002/104
USPC ........................................ 385/5–24
See application file for complete search history.

(56) References Cited

U.S. PATENT DOCUMENTS

| | | | | |
|---|---|---|---|---|
| 5,103,494 A | * | 4/1992 | Mozer ................ | G02F 1/065 385/14 |
| 5,311,534 A | | 5/1994 | Mori et al. | |
| 6,323,985 B1 | * | 11/2001 | Maloney ............ | G02F 1/015 257/446 |
| 6,437,891 B1 | * | 8/2002 | Chandrasekhar ...... | H04B 10/43 257/80 |
| 6,808,327 B2 | * | 10/2004 | Iwata ................. | B41J 15/042 235/7 R |
| 7,512,296 B2 | * | 3/2009 | Kwon .............. | G02B 6/12007 359/349 |
| 8,417,081 B2 | * | 4/2013 | Carter ............... | H01L 27/3269 257/81 |
| 2003/0081923 A1 | * | 5/2003 | Nakamura ........... | B82Y 20/00 385/131 |
| 2003/0146440 A1 | | 8/2003 | Murata et al. | |
| 2003/0194193 A1 | | 10/2003 | Masuda | |
| 2004/0079961 A1 | * | 4/2004 | Taylor ............... | H01L 29/155 257/113 |
| 2004/0081467 A1 | | 4/2004 | Taylor et al. | |
| 2015/0349187 A1 | * | 12/2015 | Taylor ............... | H01L 31/1136 385/14 |

* cited by examiner

*Primary Examiner* — Akm Enayet Ullah
(74) *Attorney, Agent, or Firm* — Allen, Dyer, Doppelt, Milbrath & Gilchrist, P.A.

(57) ABSTRACT

An optical waveguide in a semiconductor material, may include, between two adjacent portions of the waveguide, a plurality of parallel strips of alternating conductivity types forming a plurality of opposing bipolar junctions between the two adjacent portions.

10 Claims, 2 Drawing Sheets

OPTICAL WAVEGUIDE TO BE CARRIED BY A SEMICONDUCTOR MATERIAL INCLUDING A PLURALITY OF PARALLEL STRIPS OF ALTERNATING CONDUCTIVITY TYPES AND RELATED METHODS

TECHNICAL FIELD

The invention relates to devices for protecting electronic components against electrostatic discharge (ESD), and more particularly to a thyristor or silicon controlled rectifier (SCR) suitable for electro-optical components.

BACKGROUND

FIG. 1A schematically shows an exemplary thyristor-based protection circuit. The thyristor is illustrated as its equivalent circuit including two bipolar transistors QP and QN. The transistor QP is a PNP transistor whose emitter forms the anode A of the thyristor, and the transistor QN is an NPN transistor whose emitter forms the cathode C of the thyristor. The base of the transistor QP is connected to the collector of transistor QN and forms the anode gate GA of the thyristor. The base of the transistor QN is connected to the collector of transistor QP and forms the cathode gate GC of the thyristor.

In the illustrated protection circuit, the cathode C is connected to the ground Vss, and the anode A is used to protect an input/output terminal of an integrated circuit, or a specific component of the circuit. The cathode gate GC is connected to ground via a depolarization resistor Rd. The anode gate GA is connected to ground via a voltage source Vt defining the latching threshold of the thyristor. The voltage source Vt is generally in the form of a diode stack or a Zener diode. A series resistor Rga represents the resistance of the gate GA.

FIG. 1B shows a current-voltage characteristic of a thyristor protection component of the type of FIG. 1A. The values I and V correspond to the anode current and the anode voltage. As long as the voltage V does not reach a threshold VBO defined by voltage source Vt and resistance Rga, the thyristor is blocked, which is indicated by the low level of the current I at the lower portion of the characteristic.

If the voltage V has a surge exceeding the threshold VBO, the thyristor turns on and pulls the voltage on anode A to ground, causing a sudden drop of voltage V and an increase of the current I. If the source of the surge has enough power, the current I grows rapidly, but the voltage V stays within acceptable limits.

Once latched, the thyristor remains on as long as the current remains above a hold threshold IH. The thyristor is actually latched when the gate current, here the emitter-base current of the transistor QP, exceeds a threshold noted IL on the characteristic. The threshold voltage VBO depends on the configuration of the control circuit of the gate. In some configurations the voltage source Vt is omitted, i.e. the gate resistor Rga is connected to ground Vss, and the latching threshold of the thyristor is set using only the value of the resistor Rga, so that:

$$VBO = Vb + Rga \cdot IL$$

where Vb is the emitter-base conduction threshold of transistor QP.

The hold current IH of the thyristor is a parameter usually controlled by design. In some situations, it is also desirable to control the value of gate resistor Rga. Bipolar and CMOS technologies permit the manufacture of thyristors and the adjustment of their parameters using manufacturing steps that fit well within standardized manufacturing processes.

It may also be desirable to protect electro-optical components made of semiconductor materials against ESD and voltage surges. Optical and electro-optical components that one desires to integrate together are relatively simple compared to components that are integrated in CMOS technology, whereby dedicated manufacturing techniques have been developed for optical components that are relatively inexpensive compared to CMOS technologies. The techniques dedicated to optical components offer little flexibility for realizing protection devices such as thyristors.

SUMMARY

A thyristor may include a first optical waveguide segment in a semiconductor material, having first and second complementary longitudinal parts of opposite types of conductivity configured to form a longitudinal bipolar junction therebetween. The thyristor may also include a second optical waveguide segment in a semiconductor material, adjacent the first waveguide segment and having first and second complementary longitudinal parts of opposite types of conductivity configured to form a longitudinal bipolar junction therebetween, and a transverse bipolar junction between the second longitudinal portions of the first and second waveguide segments. An electrical insulator may be configured to separate each of the first longitudinal portions from the waveguide segment adjacent thereto.

The first longitudinal portions may be associated respectively with first and second main terminals of the thyristor. The second longitudinal portions may be associated respectively with first and second gates of the thyristor.

The electrical insulator may be configured to penetrate into the second longitudinal portions. The second longitudinal portions are joined by a conductive portion narrower than the width of the second longitudinal portions. The width and the length of the narrowed conductive portion may be selected to adjust the holding voltage of the thyristor.

The thyristor may include, for each gate, a respective terminal located on the corresponding second longitudinal portion, at a distance from the transverse junction selected to adjust the gate resistance. The second longitudinal portions may be wider than the first longitudinal portions, and the first longitudinal portions of the first and second segments may be located on either side of a longitudinal axis.

To electrically isolate two adjacent portions of an optical waveguide, such as the first longitudinal portions mentioned above, a plurality of parallel strips may be provided of alternating types of conductivity forming a plurality of opposing bipolar junctions between the two adjacent portions. At least one of the strips may be floating. The strips may be configured transversely to define a longitudinal narrowed conductive zone between two adjacent sections of the waveguide.

DESCRIPTION OF EMBODIMENTS

Figure 2:
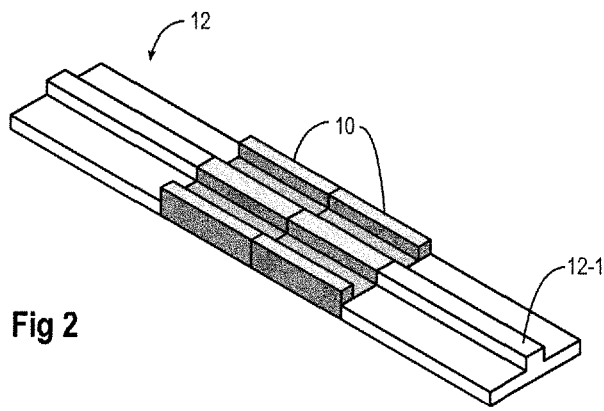
FIG. 2 is a schematic diagram of an optical waveguide integrating electro-optical components in accordance with an embodiment of the present invention.

FIG. 2 is a perspective view of a length of an optical waveguide 12 comprising two electro-optical components 10. The components 10 are, for example, a static phase shifter and a dynamic phase shifter. The waveguide is in the form of a flat profile of a monolithic semiconductor material that is preferably intrinsic or lightly doped to reduce optical losses.

As shown, the waveguide 12 may be a rib waveguide, comprising a raised central portion 12-1 forming the rib and two lateral wings on either side of the rib. Most of the optical power of the waveguide is then transported in the vicinity of the rib. In SOI technology, the waveguide has a typical height of 300 nm.

The components 10 are configured to replace waveguide segments. For example, they can be formed from the waveguide itself through etching and doping steps. Thus, the components 10 have substantially the same profile as the waveguide assembly, in particular in the center for maintaining uniform optical wave guiding characteristics. The wings of the waveguide at the level of the components 10 may bear contact terminals for using the components. These terminals are generally formed on raised edges of the wings, reaching levels of metal, as shown.

Figure 3:
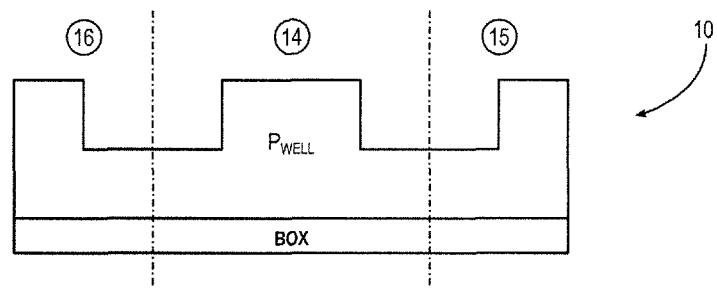
FIG. 3 is a schematic cross-sectional view of an electro-optical component in accordance with an embodiment of the present invention.

FIG. 3 is a schematic sectional view of a generic electro-optical component 10. The cross section plane is perpendicular to the axis of the optical waveguide.

The component comprises a central portion 14 and two lateral portions 15 and 16 on both sides. The central portion 14 conforms to the profile of the waveguide and is often of P type conductivity. The doping level is as low as possible to reduce optical losses while providing the desired function. The doping level of the original substrate may be used, for example (noted $P_{WELL}$, approximately $10^{17}$ atoms per cm$^3$).

An electro-optical component is often a diode that may have various configurations and uses. For this purpose, one of the zones 15, 16 is of P type conductivity while the other is N type conductivity to form a PN junction in the central zone 14. Typically, doping levels that increase from the center to the edges are used, which limit the optical losses in the center while reducing the resistivity of the component to improve its electrical characteristics. The waveguide and the components may be formed on an insulating substrate, e.g. buried oxide BOX.

The PN junctions thus created in this type of component may be damaged by voltage surges reaching the reverse breakdown voltage of the junctions. So it is desirable to protect these components from such surges.

Figure 4:
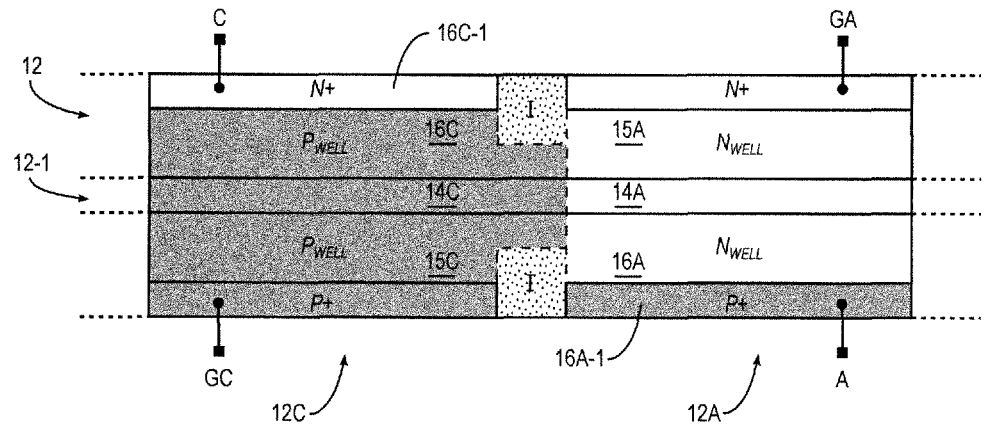
FIG. 4 is a top view of a thyristor formed in an optical waveguide according to an embodiment of the present invention.

Hereinafter embodiments of thyristors are provided, which do not involve modification of existing manufacturing techniques of the electro-optical components. FIG. 4 is a top view of an embodiment of a thyristor formed in a waveguide 12 made of semiconductor material, for example of the type having a central rib 12-1. The areas of P type conductivity are shown in gray, and the areas of N type conductivity are shown in white. The thyristor comprises two adjacent waveguide segments, a cathode-side segment 12C and an anode-side segment 12A.

The segment 12C has a structure similar to an HSPM phase-shifter, i.e. comprising a longitudinal central portion 14C and a first wing 15C, both of P type conductivity. The distal portion 16C-1 of the second wing 16C is of N type conductivity so as to form a bipolar junction with the central zone.

The segment 12A has a complementary HSPM phase-shifter structure, i.e. comprising a central longitudinal portion 14A and a first wing 15A, both of N type conductivity. The distal portion 16A-1 of the second wing 16A is of P type conductivity so as to form a bipolar junction with the central zone.

The adjacent central zones 14C and 14A of the two segments form a third bipolar junction. Although references 14C and 14A designating the central zones are represented in the rib 12-1 of the waveguide, these references denote a wider area, in particular a zone that is preferably devoid of elements that may disrupt the propagation of the optical wave.

The wings 15A and 16A of segment 12A are shown adjacent, respectively, to the wings 16C and 15C of the segment 12C, but the reverse configuration is also possible. The choice of the relative positions of the wings depends on the desired locations of the terminals of the obtained thyristor. Each of the distal portions 16C-1 and 16A-1 is electrically insulated from the adjacent waveguide segment by an insulating zone I, for example silicon oxide. With this configuration, a thyristor is obtained, whose anode A is in the distal portion 16A-1, the cathode C in the distal portion 16C-1, the anode gate GA in the wing 15A, and the cathode gate GC in the wing 15C.

As shown, the main doping level of segments 12C and 12A may be the well doping level ($P_{WELL}$, $N_{WELL}$). The edges of these segments, on which are formed the contacts of the terminals of the thyristor, preferably have a high doping level to reduce the resistivity, level noted N+, P+, corresponding for example to $10^{19}$ atoms per cm$^3$. The high doping level (N+, P+) may extend over the entire length and height of the segment. The edges may be raised relative to the plane of the guide (FIG. 3) to be connected throughout their length to conductor tracks.

It is often desirable to design the thyristor with a given holding voltage (VH) and a given latching current (IL). In the configuration of FIG. 4, this may be achieved by adjusting the characteristics of the junction between the central zones 14C and 14A with the width and length of the central conductive area remaining between the insulating zones I. The holding voltage depends on the gains of the NPN and PNP bipolar transistors and thus on the configuration of their bases. Increasing the length of the insulating zone I decreases the gains of the transistors, inducing a higher hold voltage. Similarly, increasing the length of the insulating zone I also increases the associated resistivity, finally inducing a lower latching current. A widening of the zone I also induces a resistivity increase.

As shown, this central conductive zone may essentially be of P type conductivity. Indeed, for a same doping level, P-type silicon is more resistive and offers a greater margin of adjustment. The doping level also affects the resistivity.

The width of the central conductive zone is limited to the active region of the waveguide, which extends beyond either side of the central rib. Indeed, this active region is preferably devoid of interfering elements such as an insulator opaque to the used wavelength. Once this limit width is reached, the resistivity can only be increased by extending longitudinally the central conductive zone, which increases the length of the thyristor.

Figure 5:
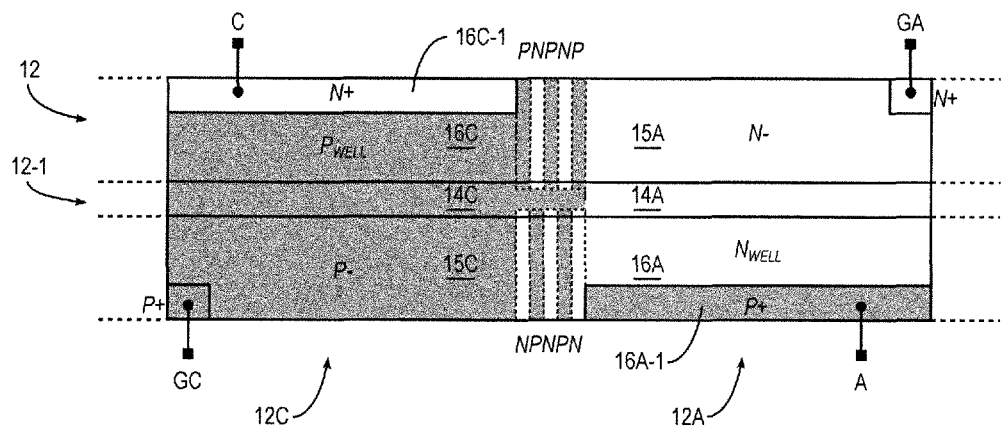
FIG. 5 is a top view of a thyristor according to another embodiment of the present invention.

FIG. 5 is a top view of an embodiment of a thyristor in a waveguide using an electrical isolation technique that generally does not disturb the optical wave. This isolation technique allows the reduction in width of the central conductive zone beyond the bounds of active region of the waveguide.

Each of the isolation regions I of FIG. 4 has been replaced by a zone doped according to transverse strips of alternating conductivity types, each strip starting from the edge of the waveguide. The strips may be doped over the entire height of the waveguide and form several opposing transverse bipolar junctions. The opposing junctions prevent DC current from flowing perpendicular to the strips.

The strips and their junctions being of same nature than the rest of the waveguide, they do not disturb the propagation of the optical wave. They can thus, as shown, penetrate into the active region of the waveguide to make the central conductive zone as narrow as desired.

To avoid leakage currents, at least one intermediate strip is configured to be electrically floating. In FIG. 5, each insulating zone comprises five strips as an example, among which two N-type strips are floating.

Preferably the first and last strips are of conductivity types opposite to those of the two respective elements to isolate, which increases the number of opposing junctions. Thus, as shown, the first and last strips in the zone between the elements 15A and 160-1 are of P type conductivity, while the first and last strips in the zone between the elements 150 and 16A-1 are of N type conductivity.

The P-type strips may be extensions of the narrowed central zone and have the same doping level ($P_{WELL}$). The N-type strips may have the doping level of the central zone 14A ($N_{WELL}$).

FIG. 5 also depicts an alternative configuration of the gate terminals GC and GA that may increase the gate resistance. As shown, the wings 15C and 15A have a low doping level, denoted P- or N-(e.g. $10^{16}$ atoms per $cm^3$), and the gate terminals GC, GA are arranged on pads that are locally doped P+ and N+ and are diametrically opposite relative to the central junction of the thyristor.

If the resistance is too high, terminals GC and GA may be brought closer to the center of the thyristor (or the P+, N+ pads be elongated toward the center of the thyristor, or the doping level of wings 15C, 15A be increased). To further increase the resistance, the wings 15C and 15A may be extended by meanders of the same nature as the wings, at the ends of which are arranged the gate terminals.

Figure 1A:
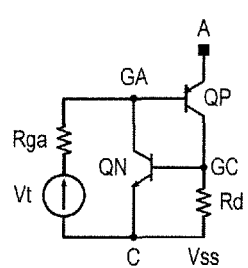
FIG. 1A is a schematic diagram of a thyristor protection device in accordance with the prior art.
Figure 1B:
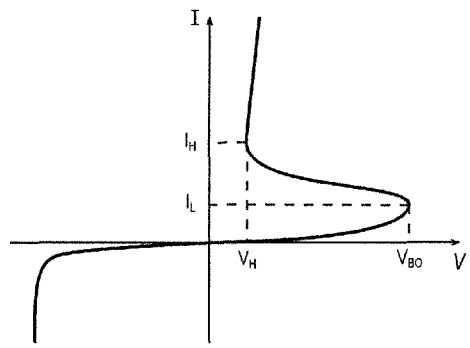
FIG. 1B is a graph of a current-voltage characteristic of the thyristor protection device in FIG. 1.

One thyristor of the type of FIG. 4 or 5 may be formed in a waveguide adjacent to each component to protect. In a configuration of the type of FIG. 1B, the cathode terminal C of the thyristor is connected to ground, and the anode terminal A to the hot terminal of the component to protect, for example the cathode of an HSPM phase-shifter. The gate terminal GC may also be connected to ground, whereby the resistivity of the wing 15C then serves as the depolarization resistance Rd. Gate terminal GA may be connected to ground as well, while the resistivity of the wing 15A is adjusted to match the desired value of the gate resistance Rga. Terminal GA may alternatively be controlled by an external, more sophisticated circuit.

As an example, the useful length of the thyristor of FIG. 5, depending on the current to absorb, may be between 4 and 20 microns (the width of the waveguide being in the order of 5 to 6 microns). The length of the insulation structure adds to the length of the thyristor. The strips of the insulation structure may be arranged at a pitch of 0.15 to 3 microns.

Many variations and modifications of the embodiments described herein will be apparent to the skilled person. Although the disclosed thyristors are designed to be integrated in a waveguide, they may also be made in dummy waveguide sections, not carrying any optical wave, arranged in the vicinity of the components to protect of a real waveguide.

The insulating structures comprising strips of alternating conductivity types have been described in an application where two adjacent zones are isolated locally. These structures may also be used to provide an overall isolation between two adjacent segments of the waveguide, for example between two electro-optical devices. In this case, the strips cross the entire width of the waveguide.

What is claimed is:

1. An optical waveguide to be carried by a semiconductor material comprising:
   first and second adjacent waveguide portions; and
   a plurality of parallel strips of alternating conductivity types between the first and second adjacent waveguide portions and defining a plurality of opposing bipolar junctions, said plurality of parallel strips being doped over an entire height of the first and second adjacent waveguide portions, said plurality of parallel strips being configured transversely to define a longitudinal narrowed conductive zone between the first and second adjacent waveguide portions.

2. The optical waveguide according to claim 1, wherein at least one of the plurality of parallel strips is electrically floating.

3. An optical waveguide comprising:
   first and second adjacent waveguide segments; and
   a plurality of parallel strips of alternating conductivity types between the first and second adjacent waveguide segments and defining a plurality of opposing bipolar junctions, said plurality of parallel strips being doped over an entire height of the first and second adjacent waveguide segments;
   said plurality of parallel strips comprising a first plurality and a second plurality of parallel strips, the first and second pluralities of parallel strips being transverse to a longitudinal axis of the optical waveguide, and laterally spaced apart from each other to define a conductive zone between the first and second adjacent waveguide segments.

4. The optical waveguide according to claim 3, wherein at least one of the plurality of parallel strips is electrically floating.

5. The optical waveguide according to claim 3, wherein the first and second pluralities of parallel strips have an alternating conductivity type relative to each other.

6. The optical waveguide according to claim 3, wherein each of said first and second waveguide segments comprises first and second wing portions and a central zone therebetween.

7. The optical waveguide according to claim 6, wherein each of said first and second waveguide segments further comprises a distal potion having an opposite conductivity type than the first and second wings portions the central zone.

8. The optical waveguide according to claim 3, wherein said first and second waveguide segments each have a different conductivity type.

9. A method of making an optical waveguide to be carried by a semiconductor material, the method comprising:

forming a plurality of parallel strips of alternating type conductivity types between first and second adjacent waveguide portions to define a plurality of opposing bipolar junctions, the plurality of parallel strips being doped over an entire height of the first and second adjacent waveguide portions, the plurality of strips being formed transversely to define a longitudinal narrowed conductive zone between the first and second adjacent waveguide portions.

10. The method according to claim 9, wherein at least one of the plurality of parallel strips is formed to be electrically floating.

* * * * *